United States Patent [19]

Hirase et al.

[11] Patent Number: 5,641,699
[45] Date of Patent: Jun. 24, 1997

[54] METHOD OF MANUFACTURING A SEMICONDUCTOR DEVICE HAVING A DUMMY CELL

[75] Inventors: Junji Hirase; Shin Hashimoto, both of Osaka, Japan

[73] Assignee: Matsushita Electric Industrial Co., Ltd., Osaka, Japan

[21] Appl. No.: 502,557

[22] Filed: Jul. 14, 1995

Related U.S. Application Data

[62] Division of Ser. No. 203,627, Mar. 1, 1994, Pat. No. 5,468,983.

[30] Foreign Application Priority Data

Mar. 3, 1993 [JP] Japan .................... 5-041600

[51] Int. Cl.⁶ .................... H01L 21/70; H01L 27/00
[52] U.S. Cl. .................... 438/130; 438/241
[58] Field of Search .................... 437/48, 52, 60, 437/43, 919

[56] References Cited

U.S. PATENT DOCUMENTS

| | | | |
|---|---|---|---|
| 4,264,965 | 4/1981 | Onishi | 365/210 |
| 4,612,565 | 9/1986 | Shimizu et al. | 257/296 |
| 4,830,977 | 5/1989 | Katto et al. | 437/52 |

*Primary Examiner*—Jey Tsai
*Attorney, Agent, or Firm*—McDermott, Will & Emery

[57] ABSTRACT

In a semiconductor device, an outer peripheral part of an integrated circuit region separated by an insulation part is defined as a dummy cell region and a center part except the outer peripheral part of the integrated circuit region is defined as an active cell region. Memory cells such as DRAM, SRAM, EEPROM, mask ROM are formed in the active cell region. In the integrated circuit region, plural cell forming regions are provided which are respectively defined by an isolation. Active cells each having a field effect semiconductor element are provided in a region included in the active cell region of each cell forming region. Dummy cells each having an element inoperable as an semiconductor element are provided in a region included in the dummy cell region of each cell forming region. At last one of dummy cells is made to be a P-N lacking dummy cell having a semiconductor element in construction including at least a gate and excluding at least one of P-N junction parts from the same construction as the field effect semiconductor element in the active cells. All dummy cells may be the P-N lacking dummy cells. Thereby, insulation defects through the P-N lacking dummy cell due to disturbance of gate pattern and the like in the dummy cell region is prevented.

5 Claims, 7 Drawing Sheets

METHOD OF MANUFACTURING A SEMICONDUCTOR DEVICE HAVING A DUMMY CELL

This is a divisional of application Ser. No. 08/203,627, filed Mar. 1, 1994, now U.S. Pat. No. 5,408,983.

BACKGROUND OF THE INVENTION

This invention relates to a semiconductor device such as DRAM, SRAM, EEPROM, mask ROM, in which cells are formed in an integrated circuit region, and particularly relates to a countermeasure for preventing insulation defect in a dummy cell provided around the integrated circuit region.

Conventionally, a semiconductor device having a memory function such as a DRAM is generally composed of a memory cell part in which a plurality of cells for memorizing information is arranged and a peripheral circuit part for controlling read-out, write-in and erasure of information. The peripheral circuit part has comparatively low pattern density and the memory cell part has high pattern density. The resolution of stepper is liable to be sensitive to change of the pattern density. Thus, the pattern of the memory cell part at the boundary to the peripheral circuit part is fractured when the pattern density of the memory cell part becomes so high to reach to resolution limit of the stepper, in the recent time.

In order to prevent the disadvantages due to pattern fracture, a well known technique is proposed such as in Laid Open unexamined Japanese Patent Application No.61-214559 that a semiconductor comprises a peripheral circuit part and a memory cell part in which unit cells are located in the form of matrix, wherein each cell located at an outer peripheral part of the memory cell part serves as a dummy cell. In other words, the dummy cell has a semiconductor element having almost the same construction as a unit cell within a normal memory cell, namely the same construction as a field effect transistor, while not functioning as a memory.

However, the above conventional semiconductor device has following problems since the dummy cell provided at the outer peripheral part of the memory cell part has the element with the same construction as the field effect transistor, while not functioning as the memory.

FIG. 7 shows the state in case where the dummy cell has the same construction as that of a unit cell of the memory cell part. In the figure, reference numeral 50 denotes the memory cell part. 60 denotes a dummy cell part. 51 denotes a unit cell provided at the memory cell part 50 and can function as a memory. The unit cell 51 is composed of a gate 51, a source/drain region 58, a bit-line contact 55 connecting to the source/drain region 53, a storage node formed above the source/drain region 53, and a storage node contact 57 connecting to the source/drain region 53. Reference numeral 61 denotes a dummy cell located in the dummy cell part 60 and it is provided with the gate 52, the source region 65, the storage node 56 and the storage node contact 57.

In the dummy cell part 60, the pattern fracture is often caused by degradation of resolution of the stepper. Short between the dummy cells 61 as shown by an array in broken line in FIG.7 (including short between the storage nodes 56) and punch-through shown by a dotted line due to fracture of polysilicon pattern may be caused by pattern disturbance in the dummy cell part 60, so that short between the unit cells 51 through the dummy cell as shown by an array in solid line in FIG. 7 is caused.

The present invention has its object of improving reliability of a semiconductor device by providing means for effectively preventing insulation defect described above in a semiconductor integrated circuit having a dummy cell part.

SUMMARY OF THE INVENTION

To attain the above object, as first means, there provides a semiconductor device formed near a surface of a semiconductor substrate, and having an integrated circuit region surrounded by an insulation part and separated from other regions, wherein an outer peripheral part of the integrated circuit region is defined as a dummy cell region and a center part except the outer peripheral part of the integrated circuit region is defined as an active cell region, wherein the semiconductor device comprises:

a plurality of cell forming regions located in the integrated circuit region including the active cell region and the dummy cell region, and each separated by an isolation;

active cells each formed in a region included in the active cell region of each cell forming regions, and each having at least one field effect semiconductor element whose construction elements are at least a gate and two source/drain regions accompanying two P-N Junction parts therebetween; and dummy cells each formed partly or entirely in a region included in the dummy cell region of each cell forming region, and each having an element not functioning as a semiconductor element, wherein, at least one of the dummy cells is a P-N lacking dummy cell having a semiconductor element of which construction is such that at least one of the P-N junction parts is excluded from a same construction as the field effect semiconductor element in the active cell and at least the gate is included.

According to the above construction, because the P-N lacking dummy cell does not have two P-N Junction parts which are necessary for functioning as the field effect semiconductor element, the insulation defect such as the short between the active cells through the P-N lacking dummy cell is prevented even with an incomplete isolation part between the gates due to disturbance of pattern in the dummy cell region. Thus, the semiconductor device has improved reliability by locating the P-N lacking dummy cell at a part likely to be disturbed of pattern in the dummy cell region according to the types of semiconductor devices.

In the first means, all dummy cells may be the P-N lacking dummy cells. Thereby, the short through the dummy cell in any types of semiconductors is surely prevented.

In the first means, in case where the active cell has a source/drain region formed by tilted ion implantation and an impurity diffusion region such as punch-through stopper, a P-N holding dummy cell which has the same construction as the field effect semiconductor element in the active cell and has a semiconductor element inoperable as an element is formed in a region included in the dummy cell region of each cell forming region and located in a direction conforming with a direction of titled ion implantation to the active cells in the active cell region, and the P-N lacking dummy cell is formed in a region included in the dummy cell region of each cell forming region and excluded from a region where the P-N holding dummy cell is to be formed. Particularly, in case where the active cell region is composed of DRAM memory cells, the P-N lacking dummy cells and the P-N holding means are located alternately.

Accordingly, the insulation defect such as the short between the active cells through the dummy cell is prevented, while the tilted ion implantation can be effectively conducted.

In addition to the first means, a punch-through stopper may be formed deep in at least the source/drain region of the semiconductor element of the P-N lacking dummy cell, or a channel stopper to which impurity is introduced is formed below the isolation included in the dummy cell region. Thereby, the reliability is further improved.

As second means in the present invention, there is provided a semiconductor device formed near a surface of a semiconductor substrate, and having an integrated circuit region surrounded by an insulation part and defined from other regions, wherein an outer peripheral part of the integrated circuit region is defined as an active cell region and a center part except the outer peripheral part of the integrated circuit region is defined as a dummy cell region, wherein the semiconductor device comprises:

- a plurality of cell forming regions arranged in the integrated circuit region including the active cell region and the dummy cell region, and respectively defined by an isolation;
- active cells each formed in a region included in the active cell region of each cell forming region, and each having at least one field effect semiconductor element whose composition elements are at least a gate, a source/drain region and a channel region;
- a P-N holding dummy cell formed in a region included in the dummy cell region of each cell forming region, and having a semiconductor element which has the same construction as the field effect semiconductor element in the active cell and is inoperable as an element;
- a heavily doped channel stopper to which impurity is more heavily doped below the isolation included in the dummy cell region than below the isolation included in the active cell region.

Accordingly, the insulation defect such as the short between the active cells through the dummy cell is effectively prevented, while using a conventional P-N holding dummy cell.

In the present invention, there provides a method of manufacturing the semiconductor device with the construction of the first means. Namely, a method of manufacturing a semiconductor device formed near a surface of a semiconductor substrate, and having an integrated circuit region surrounded by an insulation part and separated from other region, wherein an outer peripheral part of the integrated circuit region is defined as a dummy cell region and a center part except the outer peripheral part of the integrated circuit region is defined as an active cell region, the method comprising the steps of:

- forming a field oxide layer on the semiconductor substrate which is to be the insulation part and to be an isolation defining the integrated circuit region into a plurality of cell forming regions;
- introducing an impurity for forming a channel region near the surface of the semiconductor substrate;
- forming a gate on the semiconductor substrate and the filed oxide layer;
- forming a photo-mask for covering at least a part of the dummy cell region;
- forming a source/drain region at each cell forming region of the active cell region by ion implantation of impurity having a conductive type inverse to that of the semiconductor substrate, using the photo-mask and the gate as a mask; and
- removing the photo-mask at the dummy cell region after the step of forming the source/drain region.

In the method of manufacturing the semiconductor device, in the step of forming the photo-mask, the photo-mask covering a region of the dummy cell region which excludes a part located in a direction conforming with a direction of tilted ion implantation to a impurity diffusion region of the active cell in the active cell regions is formed. Especially in case of DRAM, the photo-mask is provided with forming part and open parts which are alternately arranged in a direction parallel with the gate. Thereby, the tilted ion implantation is effectively conducted.

Before the step of forming the gate, a punch-through stopper is formed by impurity ion implantation deeply to the semiconductor substrate. Further, a channel stopper is formed by impurity Ion Implantation below the field oxide layer. Thereby, a semiconductor device with high reliability is manufactured.

DETAILED DESCRIPTION OF THE INVENTION

Description is made below about embodiments of the present invention, with reference to accompanying drawings.

(FIRST EMBODIMENT)

Figure 1:
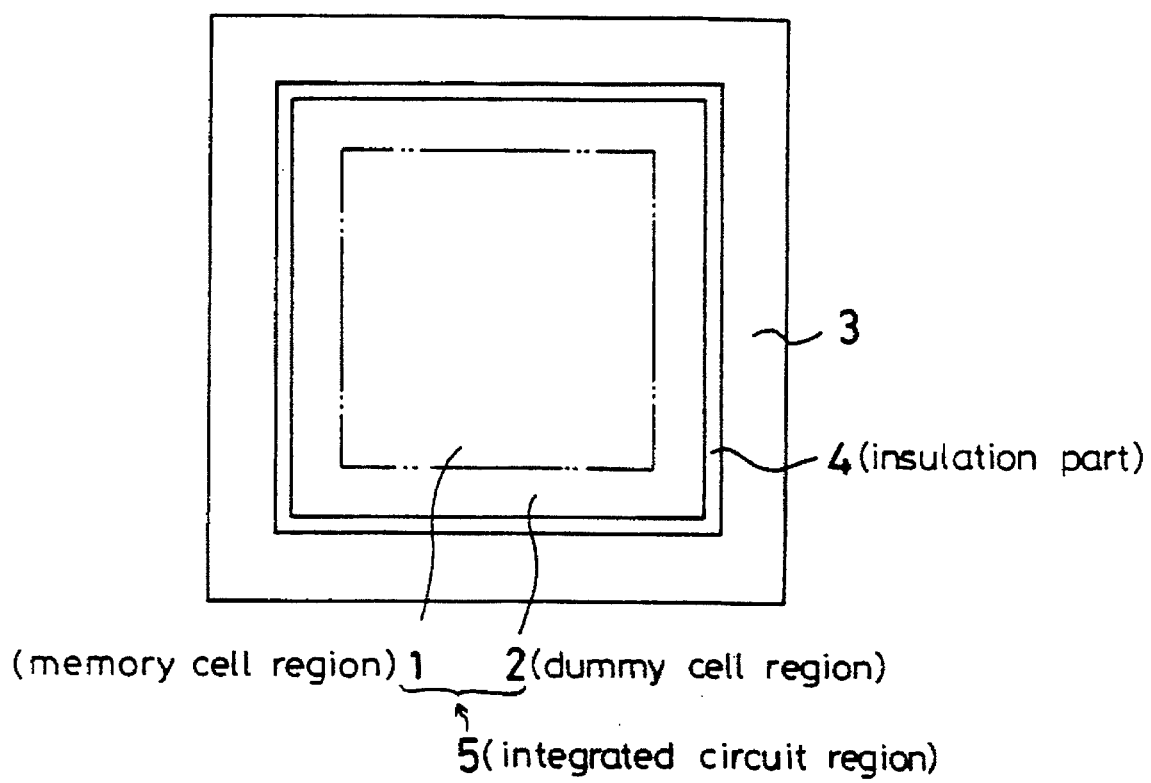
FIG. 1 is a plan view schematically showing a whole construction of a semiconductor device according to embodiments.

The first embodiment is discussed, with reference to FIGS. 1, 2(a), 2(b) and 3(a)-3(d). FIG. 1 is a plan view schematically showing a whole construction of a DRAM as a semiconductor device. In the figure, reference numeral 1 denotes a memory cell region as an active cell region at which active cells are to be formed. 2 denotes a dummy cell region around the memory cell region 1 where dummy cells are to be formed. The memory cell region 1 and the dummy cell region compose an integrated circuit region 5. 3 denotes a peripheral circuit region formed outside of the integrated circuit region 5 for controlling operation of the memory cells in the memory cell region 1. 4 denotes an insulation part for isolating the integrated circuit region 5 from the peripheral circuit region 3.

Figure 2A:
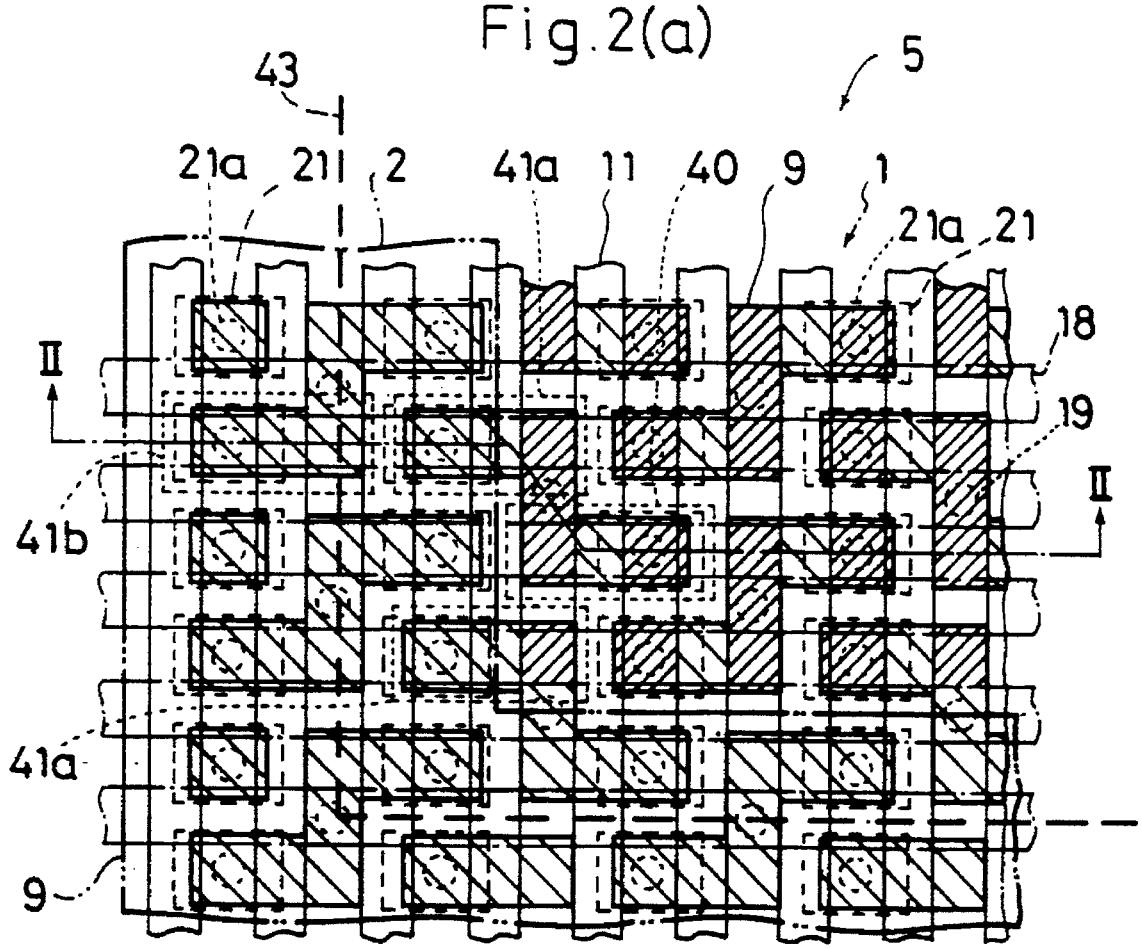
FIG. 2(a) is a plan view showing in detail a construction around a corner part in a DRAM memory cell array according to a first embodiment.
Figure 2B:
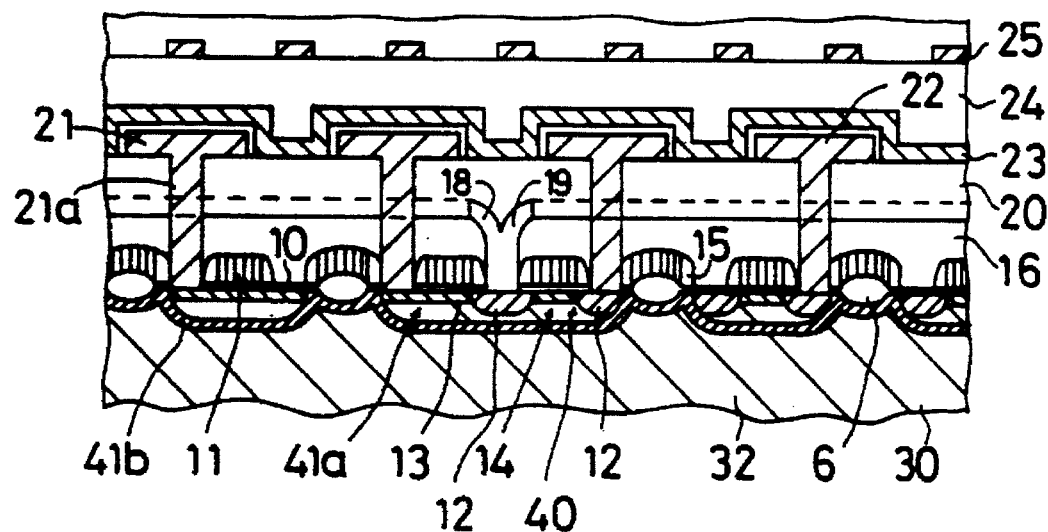
FIG. 2(b) is a section, taken along a line II—II in FIG. 2(a).

FIG. 2(a) shows in enlarged scale a corner part of the integrated circuit region 5 which includes the memory cell region 1 and the dummy cell region 2 in FIG. 1. FIG. 2(b) is a section, taken along a line II—II in FIG. 2(a). Wherein, elements above an upper-layer wiring and the like are omitted from FIG. 2(a).

As shown in FIGS. 2(a) and 2(b), an isolation 6 defines the integrated circuit region 5 into a plurality of cell forming regions 9. Two cells corresponding to two bits are formed in each cell forming region. The active cell formed at each cell forming region 9 included in the active cell region 1 has a field effect transistor 14 composed of a gate oxide layer 10, a gate 11, a source/drain region 12 composed of only a lightly doped source/drain region formed by doping N-type impurity near the surface of the semiconductor substrate 30, and a channel region 13 which is formed right below the gate 11 and to which P-type impurity is doped for adjusting the threshold voltage. Two P-N Junction parts are formed between the source/drain regions 12, 12. In this case, since the transistor 14 is in LDD structure, sidewalls 15 are provided at both sides of the gate 11. A first inter-layer insulation layer 16 is deposited on the gate 11, and a bit line 18 across at a right angle the gate 11 (Word line) is formed on the first inter-layer insulation layer 16. The bit line 18 contacts to the source/drain region 12 via the bit-line contact 19. Further, a second inter-layer insulation layer 20 is deposited on the bit line 18. A storage node 21, a storage-node contact 21a connecting the storage node 21 and the source/drain region 12, a capacity insulation layer 22 and an opposed electrode 23 are formed on the second inter-layer insulation layer 20. A third inter-layer insulation layer 24 is deposited on the opposed electrode 23, and an aluminum wiring 25 is provided on the third inter-layer insulation layer 24. A channel stopper region 31 is formed right below the isolation 6, and a punch-through stopper region 32 is formed below the source/drain region 12.

In other words, each memory cell 40 of active cell functioning as a memory is composed of the field effect transistor 14, the storage node 21, the storage-node contact 21a, the capacity insulation layer 22 and the opposed electrode 23 in the active cell region 1.

Referring to cells to be formed at the dummy cell region 2, for example, in a cell 41a ranging over the dummy cell region 2 and the memory cell region 1, the source/drain region 12 is formed at a part included in the memory cell region 1 while it is not formed at a part included in the dummy cell region 2, where a P-type impurity is diffused lightly, as well as in the channel region 13. In other words, one of the two source/drain regions 12 to be necessary for functioning as a field effect transistor is not formed in the cell 41a. Or, the two P-N Junction parts are not formed, with a result of not functioning as a field effect transistor. A cell 41b entirely included in the dummy cell region 2 is a region where the P-type impurity is diffused lightly. Accordingly, without any P-N Junction part, elements of the cell 41b do not function as the field effect transistors. As described above, the cells partly or entirely included in the dummy cell region 2 are P-N lacking dummy cells 41 each of which has a semiconductor element including at least the gate 11 and excluding at least one of the P-N junction parts from the same construction as the field effect transistor 14.

Figure 7:
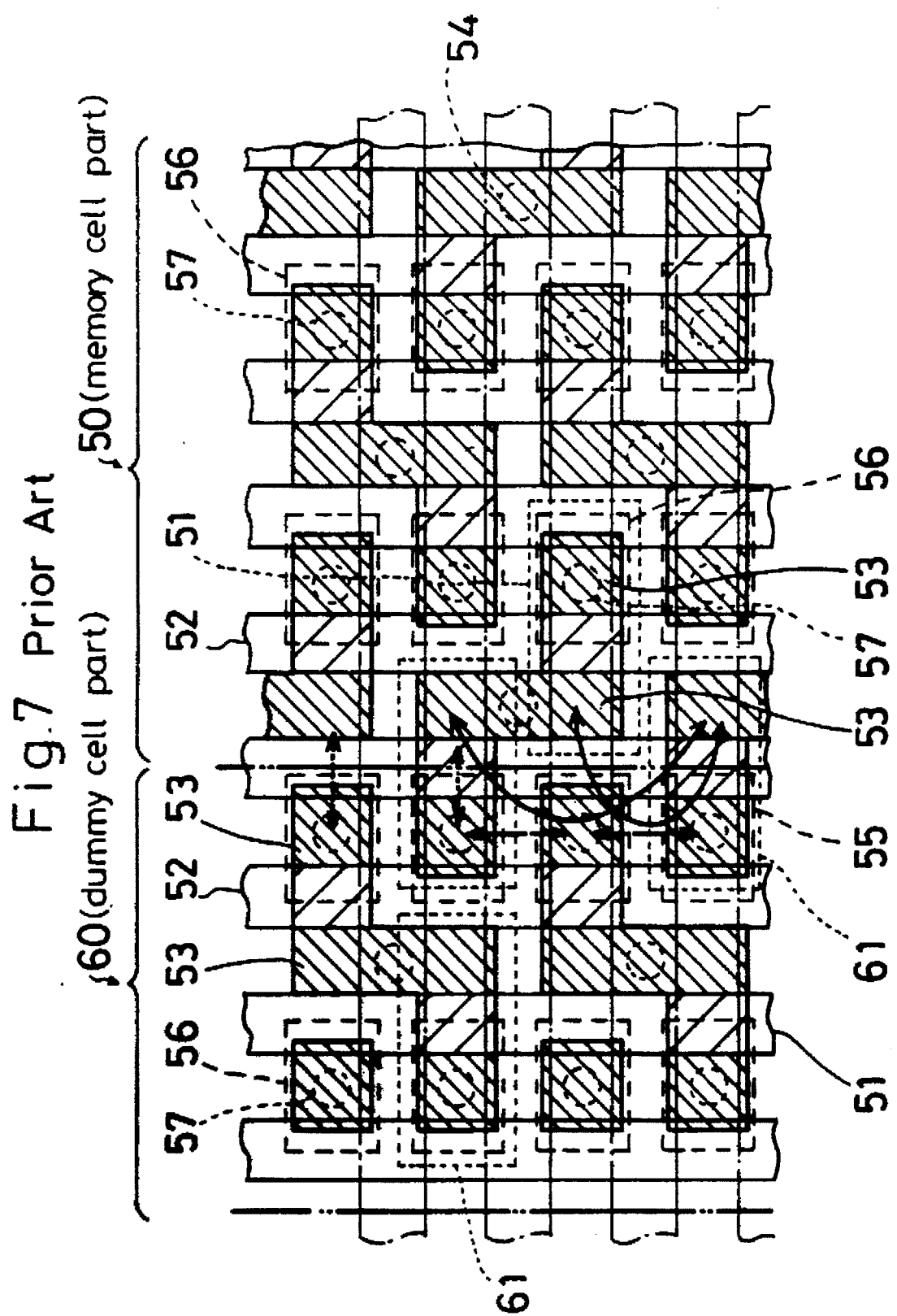
FIG.7 is a plan view explaining an insulation defect caused in a dummy cell region of a conventional DRAM.

Different from a conventional dummy cell in which two source/drain regions are formed, in the P-N lacking dummy cell, even if the short between the dummy cells 61 (FIG. 7) or opening of the pattern is caused owing to pattern disturbance of the dummy cell, the insulation defect such as the short between the memory cells (active cells) through the dummy cell is prevented surely, since each dummy cell does not have two P-N Junction parts.

Wherein, in this embodiment, all the cells which is partly or entirely included in the dummy cell region 2 are the P-N lacking dummy cells. However, this invention is not limited to this embodiment. It is possible according to types of semiconductor devices that the P-N lacking dummy cells 41 are located, for example, at the corner and the like, where the pattern is especially likely to be disturbed, and the other dummy cells are P-N holding dummy cells with the P-N Junction parts as well as the conventional dummy cell. Also, the bit line, bit-line contact, storage node, storage-node contact are provided in the dummy cell region, but some or all of these are not necessarily provided therein. The boundary of the dummy cell region and the memory cell region is to limited to the part shown in FIG. 2(a). The broken line 43 in FIG. 2(a) may be the boundary thereof.

Figure 3A:
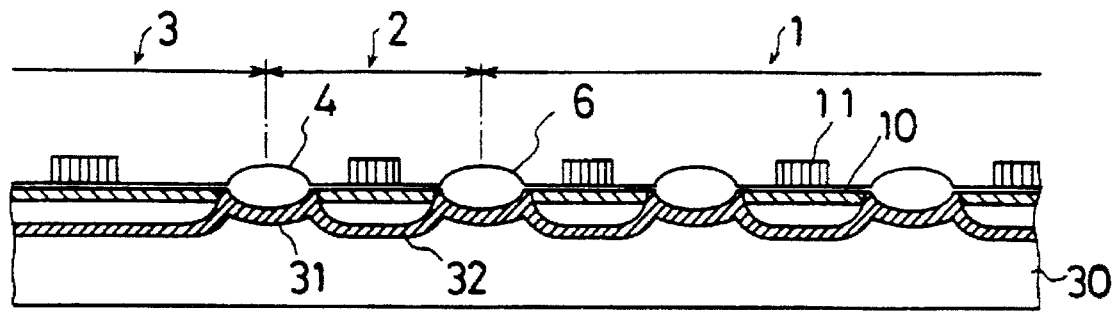
FIGS. 3(a)-3(d) are sections respectively showing a process of manufacturing a DRAM according to the first embodiment.

Described next is about a method of manufacturing a semiconductor device according to the first embodiment, with reference to FIGS. 3(a)–(d). As shown in FIG. 3(a), B (boron) ion is implanted to a surface of the P-type silicon substrate 30 (about 1E16 cm$^{-3}$) to form the channel stopper region 31 whose impurity concentration is about 1E17 cm$^{-3}$. After formation of field oxide layer functioning as the isolation 6 for isolating between the integrated circuit region 5 and the peripheral circuit region 3 and functioning as the isolation among cell forming regions 9, B (boron) ion is implanted with comparatively high energy to form the punch-through stopper region 32 whose impurity concentration is about 1E17 cm$^{-3}$. Then, the gate oxide layer 10 of 10 nm is formed on the semiconductor substrate 30. After a polysilicon layer is deposited on the gate oxide layer 10 and the isolation 6, the gate 11 is formed by patterning. The gate 11 has the thickness of 150 nm, the gate length at the peripheral circuit region 3 is 0.6 μm and the gate length at the memory cell region 1 and the dummy cell region 2 is 0.5 μm.

Figure 3B:
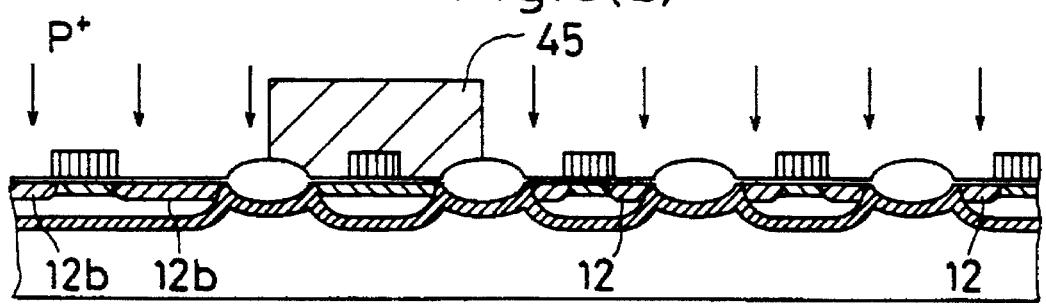

As shown in FIG. 3(b), a photo-mask 42 for lightly doped source/drain region which covers the entire dummy cell region 2 except the memory cell region 1 and the peripheral circuit region 3 is formed, and P+ (phosphorus) ion having an N-type impurity is implanted, under the conditions of 40 Kev and 3E13 cm$^{-2}$, over the photo-mask 45 and the gate 11 as a mask to form the source/drain region 12.

Figure 3C:
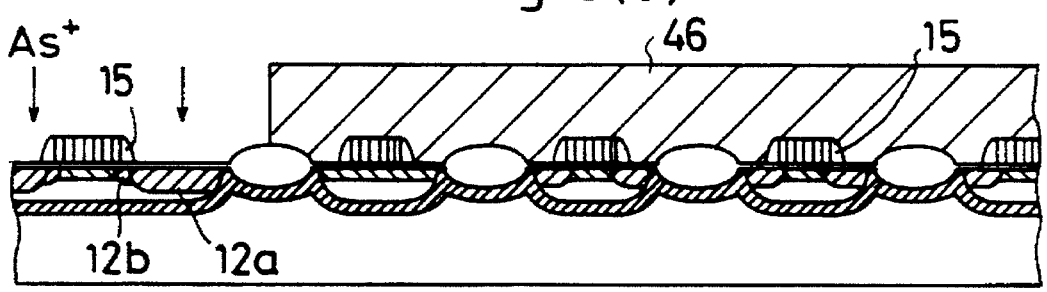

Then, as shown in FIG. 3(c), after removing the photo-mask 45, the insulation layer is deposited on the substrate and anisotropic etching is done to form the sidewalls 15. Then, a photo-mask 46 for heavily doped source/drain region which covers the memory cell region 1 and the dummy cell region 2 except at the peripheral circuit region 8 is formed. The heavily doped source/drain region 12b of the peripheral circuit region 3 is formed by implanting As+ (arsenic) ion over the photo-mask 46. In the peripheral circuit region 3, the source/drain region 12 is composed of the lightly doped source/drain region 12a and the heavily doped source/drain region 12b. The conditions for the arsenic ion implantation are 40 KeV and 6E15 cm$^{-2}$.

Figure 3D:
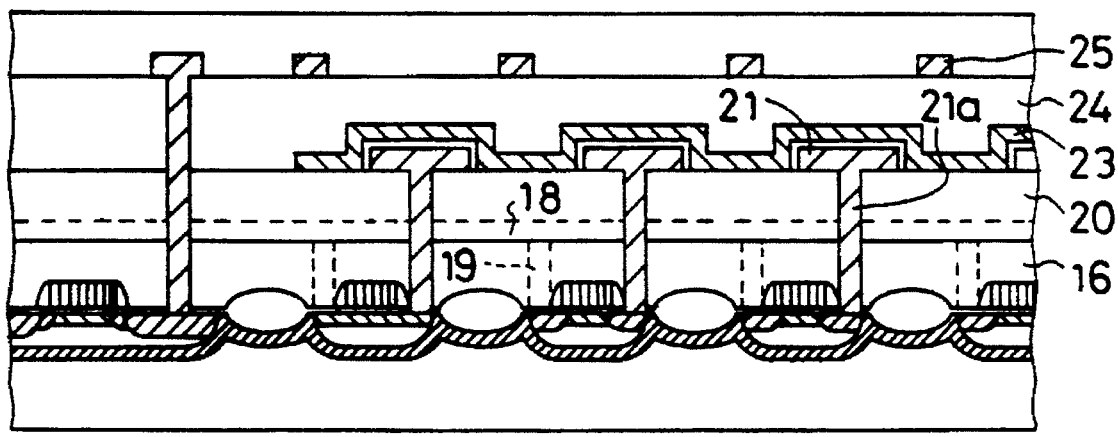

In FIG. 3(d), the first inter-layer insulation layer 16 is deposited, the bit line 18 is deposited opening the bit-line contact 19, then the second inter-layer insulation layer 20, the storage node 21, the storage-node contact 21a, the capacity insulation layer 22, the opposed electrode 23, the third inter-layer insulation layer 24 and the aluminum wiring 25 are formed thereover sequentially.

In the above manufacturing method, the photo-mask 46 for heavily doped source/drain region covers the memory cell region 1 and the dummy cell region 2, but in another method the photo-mask 46 may cover only the dummy cell region 2 as well as the photo-mask 45 for lightly doped source/drain region. For example, in case of SRAM, the transistor in the memory cell region 1 has the lightly doped source/drain region and the heavily doped source/drain region.

(SECOND EMBODIMENT)

Figure 4A:
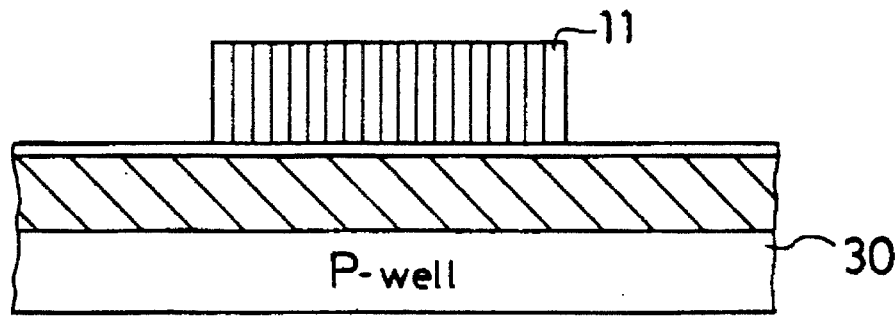
FIGS. 4(a)-4(c) are sections respectively showing a process of manufacturing a DRAM in LATIPS structure according to a second embodiment.
Figure 4B:
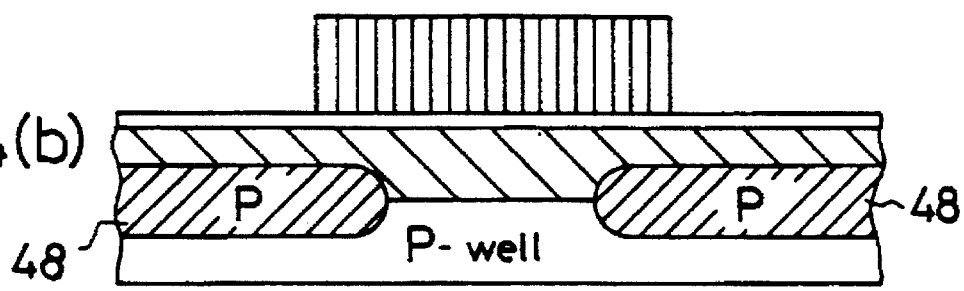

The second embodiment is discussed next, with reference to FIGS. 4(a)–(c). In the second embodiment, LATIPS (large-angle-tilt implanted punch-through stopper) method with tilted ion implantation is employed for forming the punch-through stopper region. The method for manufacturing a DRAM memory cell in LATIPS structure is described next.

Discussed in this embodiment is essential points, omitting the explanation of the identical process with that in the first embodiment. Further, only one of the field effect transistors in the memory cell is shown. After the gate etching process (in FIG. 4(a)), LAT (large-angle-tilt) implantation of $0.2 \times 10^{13}$ cm$^{-2}$ dose B (boron) is performed with a tilt-angle θ(e.g. 25°) by rotating wafers (FIG. 4 (b)).

Figure 4C:
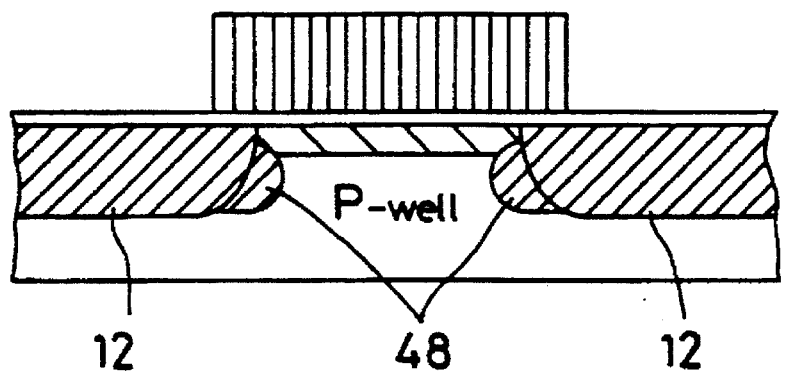

Then, the conventional 7°-off axis P (phosphorus) implantation (40 Kv, $3 \times 10^{13}$ cm$^{-2}$) is performed (FIG. 4(c)).

Finally, the sidewalls 15 are formed by anisotropic etching. Thereby, as shown in FIG. 4(c), the LATIPS region 48 is formed adjacent to the source/drain region 12.

Discussed next is about the shape of the pattern of the photo-mask used at the process of forming the LATIPS region 48 shown in FIG. 4(b). The mask is opening at a part of dummy cell which is located in a direction conforming with a direction of the tilted ion implantation for forming the LATIPS region of the memory cell arranged adjacent to the dummy cell region 2. Accordingly, the source/drain region 12 is formed at the dummy cell so as to serve as the P-N holding dummy cell 42 (dummy cell between cells 41a, 41a in FIG. 2(a). In detail, the P-N lacking dummy cells 41 and the P-N holding dummy cells 42 are alternately located at a side parallel with the gate 11 in the dummy cell region 2. In this embodiment, all of the dummy cells located in far left side and the dummy cells arranged parallel with the bit line in the dummy cell region are the P-N lacking cells.

Thus, in this embodiment, the alternate arrangement of the P-N lacking dummy cells 41 and the P-N holding dummy cells 42 prevents the short between the active memory cells due to pattern destruction in the dummy cell region 2, and does not disturb the tilted ion implantation at impurity introduction to the active cell. Thus, the feature of LATIPS structure with a excellent subthreshold characteristic is effectively obtained.

In this embodiment, the DRAM memory cell having LATIPS structure is described as the semiconductor device with the titled ion implantation. However, the present invention is not limited this embodiment, and applicable to all semiconductors in which the impurity doped region in the active cells, such as the lightly doped source/drain region (LATID), is formed by the tilted ion implantation. The dummy cells are discretely arranged, for example, according to the type of the active cells, in such a fashion that the P-N holding dummy cell is arranged at every two P-N lacking dummy cells. Thereby, the insulation defects such as the short between the active cells through the dummy cell is effectively prevented, obtaining a certain effect by the titled ion implantation.

(THIRD EMBODIMENT)

The third embodiment is described next, with reference to FIGS. 5 and 6.

Figure 5:
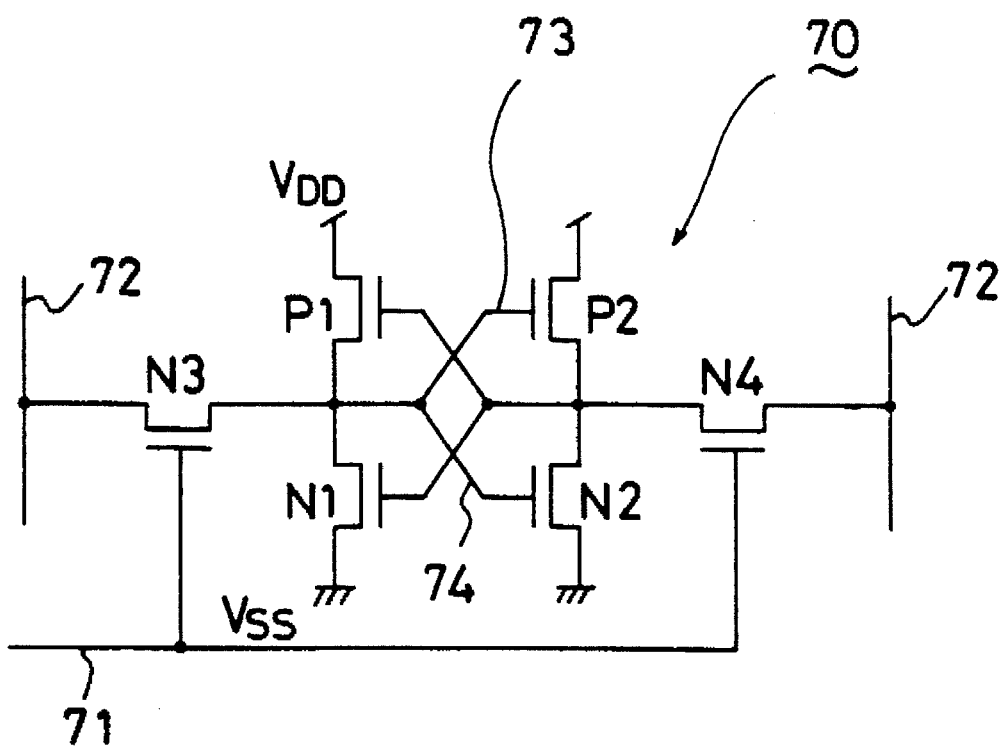
FIG. 5 is a circuit diagram showing a construction of a unit cell of a SRAM according to a third embodiment.

FIG. 5 is a circuit diagram of a field effect transistor showing one unit of a SRAM memory cell 70 according to the third embodiment. In detail, the SRAM is composed of two P-channel field effect transistors P1, P2 and four N-channel field effect transistors N1–N4, and includes word line 71 to be a gate of each transistor N3, N4, bit lines 72 to connect the transistors N3, N4 and the source/drain region 12, a wiring 73 to connect the gates of the transistors P1, N1 and the source/drain region 12 of the transistor N4, and a wiring 74 to connect the gates of the transistors P2, N2 and the source/drain region 12 of the transistor N3. The SRAM further includes a power source Vdd on drain side and a power source Vss on source side.

Figure 6:
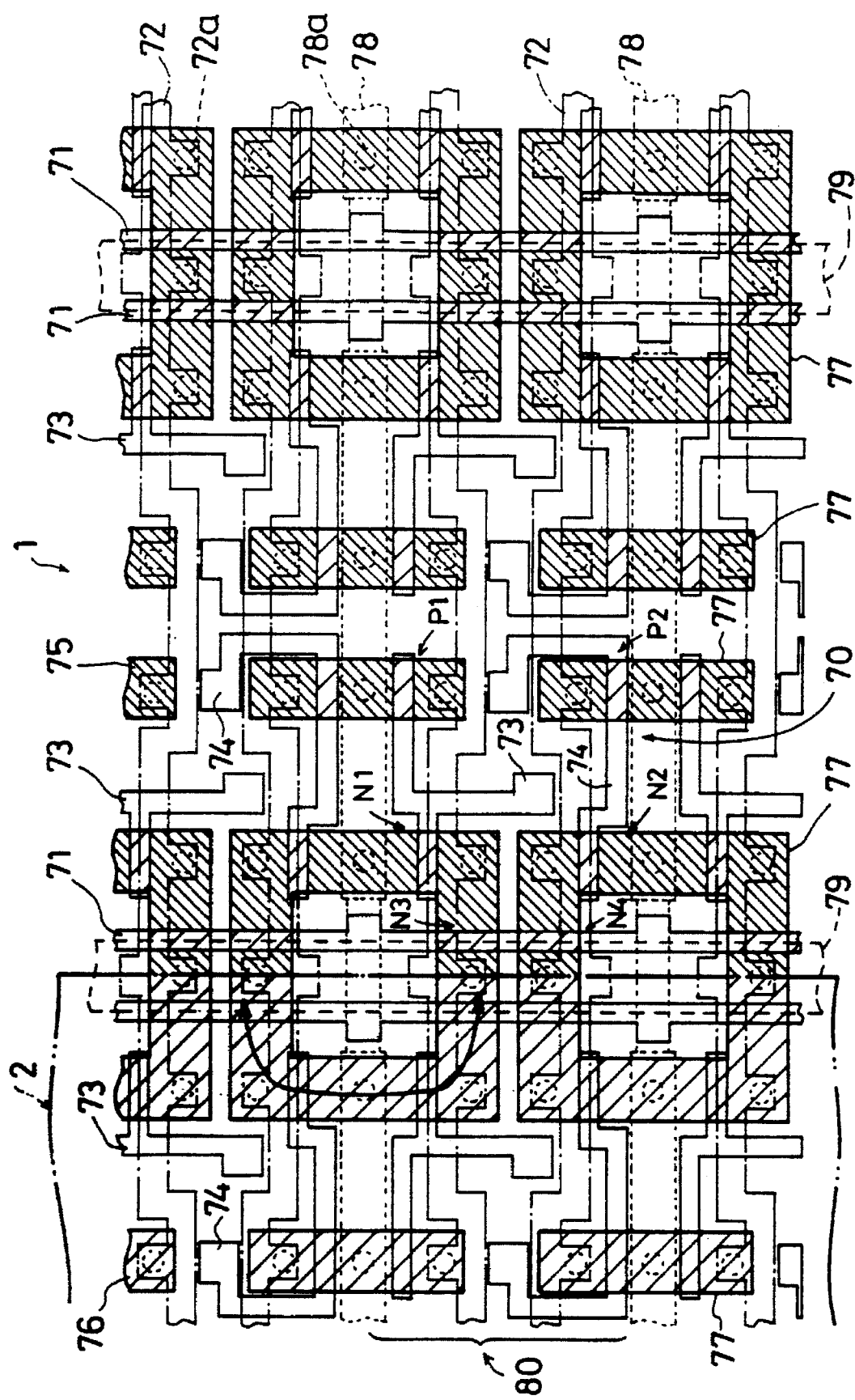
FIG.6 is a plan view showing in detail a construction of a SRAM memory cell array in the third embodiment.

FIG. 6 is a plan view showing a construction of an integrated circuit forming region on memory side of the SRAM. As shown in the figure, the isolation defines the integrated circuit forming region into a plurality of cell forming regions 77. In the cell forming region 77 located at the SRAM memory cell array which is the active memory cell region, heavy doping is performed in a part to be the source/drain region 75 of each transistor. In every region, the impurity for adjusting the threshold voltage is doped lightly to a part below the gates 71, 73, 74. The SRAM memory cell 70 composed of the six transistors P1, P2, N1–N4 shown in FIG. 5 is formed. Wherein, in the dummy cell region 2 adjacent To a peripheral circuit region (left side in FIG. 6, not shown), the impurity for adjusting the threshold voltage of the same conductive type as that in the region below the gates 71, 73, 74 is doped to the region 76 aside the gates 71, 73, 74. Namely, the P-N lacking dummy cell 80 composed of an element without the P-N junction part is arranged to the same construction as that of the SRAM memory cell.

Accordingly, in this embodiment, the insulation defects such as the short between the active cells through the P-N lacking dummy cell 80 is effectively prevented by the same effect as in the first embodiment (refer to arrow in FIG. 6).

We claim:

1. A method of manufacturing a semiconductor device formed near a surface of a semiconductor substrate, and having an integrated circuit region surrounded by an insulation part and separated from other region, wherein an outer peripheral part of the integrated circuit region is defined as a dummy cell region and a center part except the outer peripheral part of the integrated circuit region is defined as an active cell region, the method comprising the steps of:

forming a field oxide layer on the semiconductor substrate which is to be the insulation part and to be an isolation defining the integrated circuit region into a plurality of cell forming regions;

introducing an impurity for forming a channel region near the surface of the semiconductor substrate;

forming a gate on the semiconductor substrate and the field oxide layer;

forming a photo-mask for covering at least a part of the dummy cell region;

forming a source/drain region at each cell forming region of the active cell region by ion implantation of impurity having a conductive type inverse to that of the semiconductor substrate, using the photo-mask and the gate as a mask; and removing the photo-mask at the dummy cell region after the step of forming the source/drain region.

2. The method of manufacturing a semiconductor device according to claim 1, wherein at the step of forming the photo-mask, the photo-mask covering a region of the dummy cell region which excludes a part located in a direction conforming with a direction of tilted ion implantation to the active cell in the active cell region is formed.

3. The method of manufacturing a semiconductor device according to claim 1 or 2, further comprising the step of forming a punch-through stopper by impurity ion implantation deep to the semiconductor substrate before the step of forming the gate.

4. The method of manufacturing a semiconductor device according to claim 1 or 2, further comprising the step of forming a channel stopper by impurity ion implantation below the field oxide layer.

5. The method of manufacturing a semiconductor device according to claim 2, wherein DRAM memory cells are arranged at the active cell region in the semiconductor device, and at the step of forming the photo-mask, the photo-mask is provided with forming parts and open parts which are alternately arranged in a direction parallel with the gate.

* * * * *